(12) United States Patent
Corda et al.

(10) Patent No.: US 8,395,537 B2
(45) Date of Patent: Mar. 12, 2013

(54) METHODS FOR COMPRESSING AND DECOMPRESSING MIFARE APPLICATIONS

(75) Inventors: Alexandre Corda, Nice (FR); Baptiste Affouard, Golfe Juan (FR); Vincent Lemonnier, Nice (FR)

(73) Assignee: NXP B.V., Eindhoven (NL)

( * ) Notice: Subject to any disclaimer, the term of this patent is extended or adjusted under 35 U.S.C. 154(b) by 307 days.

(21) Appl. No.: 12/812,571

(22) PCT Filed: Jan. 12, 2009

(86) PCT No.: PCT/IB2009/050101
§ 371 (c)(1),
(2), (4) Date: Jul. 12, 2010

(87) PCT Pub. No.: WO2009/090587
PCT Pub. Date: Jul. 23, 2009

(65) Prior Publication Data
US 2010/0287168 A1 Nov. 11, 2010

(30) Foreign Application Priority Data
Jan. 14, 2008 (EP) .................................. 08290030

(51) Int. Cl.
*H03M 7/46* (2006.01)
(52) U.S. Cl. ............................. 341/63; 340/5.8; 235/380
(58) Field of Classification Search .................... 341/63, 341/87, 106; 235/379–386; 340/5.1–5.42, 340/5.6–5.67, 5.8; 455/41.1–41.3
See application file for complete search history.

(56) References Cited

U.S. PATENT DOCUMENTS

| | | | | |
|---|---|---|---|---|
| 6,192,436 | B1 * | 2/2001 | Jacobson et al. | 710/104 |
| 6,647,480 | B1 * | 11/2003 | Bolan et al. | 711/170 |
| 2002/0099907 | A1 * | 7/2002 | Castelli et al. | 711/113 |
| 2012/0156995 | A1 * | 6/2012 | Breitfuss | 455/41.1 |

FOREIGN PATENT DOCUMENTS

CA 1069604 A 3/1993

OTHER PUBLICATIONS

Dhem et al., Lossless compression Algorithms for smart Cards: A Progress Report, UCL Crypto Group Technical Report Series, Universite catholique de Louvain, http://www.dice.ucl.ac.be/crypto/, Technical Report CG-1996/7, Oct. 17, 1996.*
Anonymous; "MF1 S501 Data Sheet"; retrieived from www.synometrix.com/MFA_%20S501_Data_Sheet.pdf; 18 pages.
Salomon, D. Ed; "Data Compression the Complete Reference, Passage"; New York, NY, US; Springer; 6 pages; (Jan. 1, 1998).
Salomon, D. Ed; "Data Compression; The Complete Reference; Dictionary Methods"; Springer Verlag, London, GB; 3 pages (Jan. 1, 2007).
Chinese Office Action for Application No. 2009801021197.

* cited by examiner

*Primary Examiner* — Howard Williams

(57) ABSTRACT

MIFARE applications (MIA) are organized in at least one sector comprising sector data being arranged in data blocks and a sector trailer. A compressing method for MIFARE application comprises: searching for consecutive occurrences of same data values in the sector data and replacing the detected consecutive data having the same data value by a sequence comprising said data value and a number indicating the number of consecutive sector data having that data value; and/or searching for all different sector trailer values and replacing all sector trailers by references to respective ones of the different sector trailer values.

19 Claims, 3 Drawing Sheets

| MIA | Sector Data | Sector Trailer |
|---|---|---|
| 0x00 | Unpredictable data 1 | Trailer A |
| 0x01 | Unpredictable data 2 | Trailer A |
| 0x02 | 0x00 .................0x00 | Trailer B |
| 0x03 | 0x00 .................0x00 | Trailer B |
| 0x04 | 0x00 .................0x00 | Trailer B |
| 0x05 | 0x00 .................0x00 | Trailer B |
| 0x06 | 0x00 .................0x00 | Trailer B |
| 0x07 | 0x00 .................0x00 | Trailer B |
| 0x08 | 0x00 .................0x00 | Trailer B |
| 0x09 | 0x00 .................0x00 | Trailer B |
| 0x0A | 0x00 .................0x00 | Trailer B |
| 0x0B | 0x00 .................0x00 | Trailer B |
| 0x0C | 0x00 .................0x00 | Trailer B |
| 0x0D | 0x00 .................0x00 | Trailer B |
| 0x0E | 0x00 .................0x00 | Trailer B |
| 0x0F | 0x00 .................0x00 | Trailer B |

METHODS FOR COMPRESSING AND DECOMPRESSING MIFARE APPLICATIONS

FIELD OF THE INVENTION

The invention relates to a method for compressing MIFARE applications, which are organized in at least one sector comprising sector data being arranged in data blocks and a sector trailer.

The invention further relates to a method for decompressing a data stream that contains a MIFARE application that has been compressed according to the compressing rules defined in the compressing method according to the present invention.

The invention further relates to computer program products directly loadable into the memory of a computer or a mobile communication device being equipped with a MIFARE device.

The invention further relates to a mobile communication device that comprises a classic or emulated MIFARE memory device, wherein the mobile communication device is adapted to process the computer program product mentioned in the above paragraph.

BACKGROUND OF THE INVENTION

The MIFARE® classic family, developed by NXP Semiconductors is the pioneer and front runner in contactless smart card ICs operating in the 13.56 MHz frequency range with read/write capability. MIFARE® is a trademark of NXP Semiconductors. MIFARE complies with ISO14443 A, which is used in more than 80% of all contactless smart cards today. The technology is embodied in both cards and card reader devices. MIFARE cards are being used in an increasingly broad range of applications (including transport ticketing, access control, e-payment, road tolling, and loyalty applications). MIFARE Standard (or Classic) cards employ a proprietary high-level protocol with a proprietary security protocol for authentication and ciphering. MIFARE® technology has become a standard for memory devices with key-protected memory sectors. One example for a published product specification of MIFARE® technology is the data sheet "MIFARE® Standard Card IC MF1 IC S50—Functional Specification" (1998) which is herein incorporated by reference. MIFARE® technology is also discussed in: Klaus Finkenzeller, "RFID Handbuch", HANSER, $3^{rd}$ edition (2002).

The MIFARE Classic cards are fundamentally just memory storage devices, where the memory is divided into sectors and blocks with simple security mechanisms for access control. Each device has a unique serial number. Anti-collision is provided so that several cards in the field may be selected and operated in sequence.

The MIFARE Standard 1 k offers about 768 bytes of data storage, split into 16 sectors with 4 blocks of 16 bytes each (one block consists of 16 byte); each sector is protected by two different keys, called A and B. They can be programmed for operations like reading, writing, increasing value blocks, etc. The last block of each sector is called "trailer", which contains two secret keys (A and B) and programmable access conditions for each block in this sector. In order to support multi-application with key hierarchy an individual set of two keys (A and B) per sector (per application) is provided.

The memory organization of a MIFARE Standard 1 k card is shown in FIG. 1. The 1024×8 bit EEPROM memory is organized in 16 sectors with 4 blocks of 16 bytes each. The first data block (block 0) of the first sector (sector 0) is the manufacturer block which is shown in detail in FIG. 2. It contains the serial number of the MIFARE card that has a length of four bytes (bytes 0 to 3), a check byte (byte 4) and eleven bytes of IC manufacturer data (bytes 5 to 15). The serial number is sometimes called MIFARE User IDentification (MUID) and is a unique number. Due to security and system requirements the manufacturer block is write protected after having been programmed by the IC manufacturer at production. However, the MIFARE specification allows to change the serial number during operation of the MIFARE card, which is particularly useful for MIFARE emulation cards like SmartMX cards.

SmartMX (Memory eXtension) is a family of smart cards that have been designed by NXP Semiconductors for high-security smart card applications requiring highly reliable solutions, with or without multiple interface options. Key applications are e-government, banking/finance, mobile communications and advanced public transportation.

The ability to run the MIFARE protocol concurrently with other contactless transmission protocols implemented by the User Operating System enables the combination of new services and existing applications based on MIFARE (e.g. ticketing) on a single Dual Interface controller based smart card. SmartMX cards are able to emulate MIFARE Classic devices and thereby makes this interface compatible with any installed MIFARE Classic infrastructure. The contactless interface can be used to communicate via any protocol, particularly the MIFARE protocol and self defined contactless transmission protocols.

SmartMX enables the easy implementation of state-of-the-art operating systems and open platform solutions including JCOP (the Java Card Operating System) and offers an optimized feature set together with the highest levels of security. SmartMX incorporates a range of security features to counter measure side channel attacks like DPA, SPA etc. A true anti-collision method (acc. ISO/IEC 14443-3), enables multiple cards to be handled simultaneously.

It should be noted that the emulation of MIFARE Classic cards is not only restricted to SmartMX cards, but there may also exist other present or future smartcards being able to emulate MIFARE Classic cards.

Recently, mobile communication devices have been developed which contain MIFARE devices, either being configured as MIFARE Classic cards or as MIFARE emulation devices like SmartMX cards. These mobile communication devices comprise e.g. mobile phones with Near Field Communication (NFC) capabilities, but are not limited to mobile phones.

MIFARE applications are usually installed in mobile communications devices, like NFC mobile phones, by a Service Provider or a Trusted Service Manager through an Over-The-Air (OTA) transport service of a Mobile Network Operator (MNO) which provides the full range mobile services to Customers, particularly provides UICC and NFC terminals plus said Over The Air transport services. Service Providers provide contactless services to the Customers (Service Providers are e.g. banks, public transport companies, loyalty programs owners etc.). A Trusted Service Manager securely distributes and manages the Service Providers' services to the MNO customer base. The role of the Trusted Service Manager is to provide the single point of contact for the Service Providers to access their customer base through the MNOs and to manage the secure download and life-cycle management of the Mobile NFC application on behalf of the Service Providers. Regardless whether the Service Provider or a Trusted Service Manager sends the MIFARE application to the mobile communication device due the limitation of the transfer rate of the OTA transport service (e.g. GSM communication) installation of MIFARE applications often turn out to be quite time consuming, thereby decreasing the user experience.

In order to reduce the transmission time for MIFARE applications it is considered to compress the MIFARE application before sending it over the air to the mobile communication device. However, standard compression tools, like zip for instance, are not available in all mobile communication devices, hence preventing such standard compression to be used at the transmitter side. Moreover, standard compression tools do not take into consideration the specific contents and structure of MIFARE application which results in a considerable calculating overhead which might particularly be of disadvantage when a MIFARE application which has been compressed with a standard compression tool has to be decompressed in a mobile communication device with limited calculating power. Therefore, there is still a need for a compression algorithm for MIFARE applications that takes into account the specific structure of MIFARE applications. With such a specific compression algorithm a high compression rate with low calculating effort on both the compression side and the decompression side should be achieved.

OBJECT AND SUMMARY OF THE INVENTION

In order to achieve the object defined above, with a compressing method according to the invention characteristic features are provided so that a compressing method according to the invention can be characterized in the way defined below, that is:

A method for compressing MIFARE applications, which are organized in at least one sector comprising sector data being arranged in data blocks and a sector trailer, wherein the compressing method comprises:

searching for consecutive occurrences of same data values in the sector data and replacing the detected consecutive data having the same data value by a sequence comprising said data value and a number indicating the number of consecutive sector data having that data value; and/or searching for all different sector trailer values and replacing all sector trailers by references to respective ones of the different sector trailer values.

In order to achieve the object defined above, with a decompressing method according to the invention characteristic features are provided so that a decompressing method according to the invention can be characterized in the way defined below, that is:

A method for decompressing a data stream that contains a MIFARE application that has been compressed according to the compressing rules defined in the compressing method according to any of claims 1 to 6, wherein the decompressing method comprising parsing the data stream for compressed data of the MIFARE application that comply with any of the above defined compressing rules, and if such compressed data are found, inversely apply said compressing rules on said compressed data, thereby reconstructing the MIFARE application.

In order to achieve the object defined above, with computer program products according to the invention characteristic features are provided so that computer program products according to the invention are directly loadable into either the memory of a computer or the memory of a mobile communication device, wherein the computer program products comprise software code portions for performing the steps of the compressing or decompressing method according to the present invention when said products are run either on the computer or on the mobile communication device.

In order to achieve the object defined above, a mobile communication device according to the invention comprises an arithmetic-logic unit and a memory and processes the decompressing computer program product according to the above paragraph. Such a mobile communication device is preferably configured as a mobile phone, preferably having NFC capabilities The characteristic features according to the invention provide the advantage that compression of MIFARE applications is carried out that takes into account the specific structure of MIFARE applications and thus, achieves a high compression rate with low computational efforts on both the compression side and the decompression side.

The measures as claimed in any of claims 2 to 6 provide the advantage that highly efficient compression rules are defined that can easily be implemented in software code and require low computational efforts. Further advantages will become clear when reading the following detailed description.

BRIEF DESCRIPTION OF THE DRAWINGS

The invention will be described in more detail hereinafter with reference to an exemplary embodiment. However, the invention is not limited to it.

DESCRIPTION OF EMBODIMENTS

Figures 1, 2, 3:
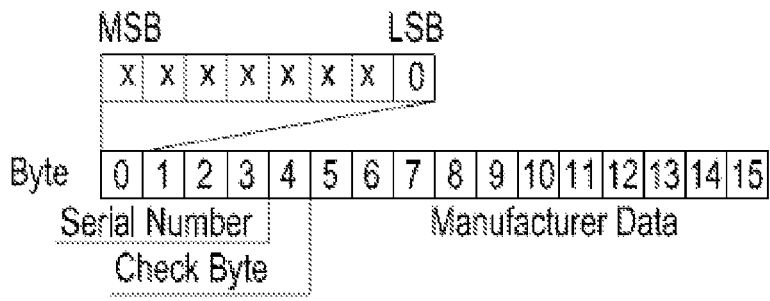
FIG. 1 shows the memory organization of a MIFARE Standard 1 k EEPROM.
FIG. 2 shows the manufacturer block of a MIFARE memory.
FIG. 3 shows the sector trailer of a sector of MIFARE memory.
Figures 4, 5:
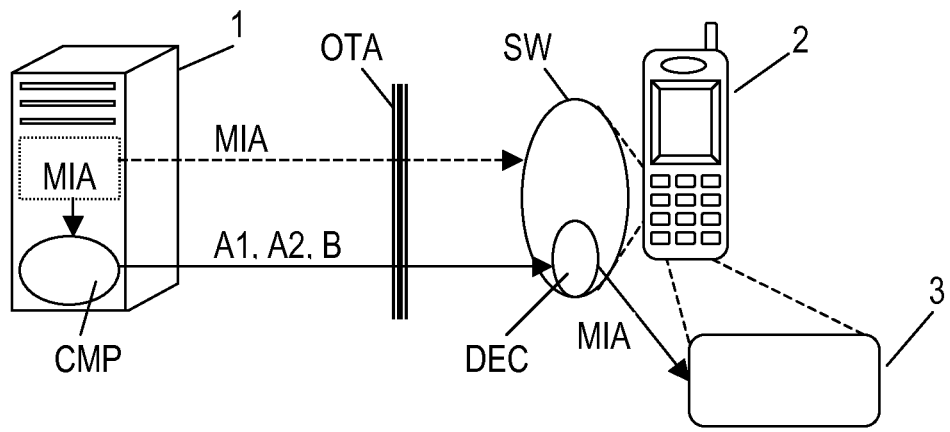
FIG. 4 shows a schematic block circuit of a telecommunication system comprising a sender, an over-the-air transmission line and a receiver in form of a mobile communication device.
FIG. 5 shows a schematic diagram of the organization of a MIFARE application.

A memory organization of a MIFARE Standard 1k EEPROM has already been explained above with reference to FIGS. 1 to 3. FIG. 5 explains general characteristics of MIFARE applications, in this particular example a MIFARE application MIA having a size of 1 kB. This will be helpful for a better understanding of the key features of the present compression algorithm. The MIFARE application shown in FIG. 5 comprises sixteen sectors (sectors 0x00 to 0x0F) each having a length of 64 bytes separated into 48 bytes of sector data and 16 bytes of sector trailer. Sectors 0x00 and 0x01 of this MIFARE application comprise a first sector trailer A which is the same for both mentioned sectors. The next fourteen sectors (sectors 0x02 to 0x0F) comprise a second sector trailer B which is the same for all sectors 0x02 to 0x0F. The sector data in the data blocks of the sectors 0x02 to 0x0F contain only the value 0x00, wherein, on the other hand, the sector data in the data blocks of the first two sectors 0x00 and 0x01 contain unpredictable data (e.g. the name of the application, some data regarding the end-user and so on).

As depicted in FIG. 4 by a dotted arrow without applying any compression mechanism the 1024 bytes of this MIFARE application MIA would have to be sent through the over the air services OTA of a Mobile Network Operator from a sender 1, e.g. a trusted Service Manager or a Service Provider, to a mobile communication device 2, such as a NFC mobile phone, containing a MIFARE memory device 3 which can be configured as a classic MIFARE memory card or an emulated MIFARE memory device. Said 1024 bytes of data could be transmitted for example as one array of 1024 bytes or as sixteen arrays of 64 bytes each. It should be noticed that the mobile communication device 2 comprises a processor and a random access memory (not shown in the drawing) for executing software SW. The software SW comprises an operating system being adapted to carry out and manage all functions of the mobile communication device 2. The software SW further includes a MIFARE applications manager with the ability to install MIFARE applications in the MIFARE memory device 3. It will be appreciated that transmitting the MIFARE application of FIG. 5 in uncompressed form through the over the air services OTA may be time consuming and is therefore not preferred. Rather, a compression algorithm CMP outlined below which can be installed in the sender 1 is of enormous advantage to reduce the data load through the over the air services OTA, thereby accelerating transmission of the MIFARE application.

For the present MIFARE application compression algorithm the following observations are essential.

Two general observations on sector trailers of MIFARE applications can be made:
  Generally, the sector trailers of multi-sector MIFARE applications have only a few different values, in most cases only one or two different values.
  In a sector trailer, key A and key B differ from each other.
The following general observations on the MIFARE application sector data can be made:
  MIFARE applications are often of two different types:
    A shell to be issued first;
    Updates to be issued later on, filling in the shell.
  The shell is often a large MIFARE application (1 KB) but contains little information. This is an almost "empty shell" (data have essentially the same value, in general 0x00).
  The updates comprise a small amount of data, in general 1 sector (48 bytes).

The present MIFARE application compression algorithm is based on the above general observations. In one aspect, compression of the MIFARE application sector trailers is based on the fact that the sector trailers of multi-sector MIFARE applications have only a few different values, usually only one or two different values.

The present compression algorithm makes use of the above observations to compress the MIFARE application.

For the MIFARE application sector data the following strategies are important:
  For the shell application where compression is really needed because of the large size of such application (1 k), the compression must make use of the fact that the values of the data within the shell application will be the same for almost all the data of the application.
  For updates which comprise a small amount of data (48 bytes) having unpredictable values trials to compress the update are not worthwhile or may even be detrimental since they could produce a larger number of data.

Figure 6:
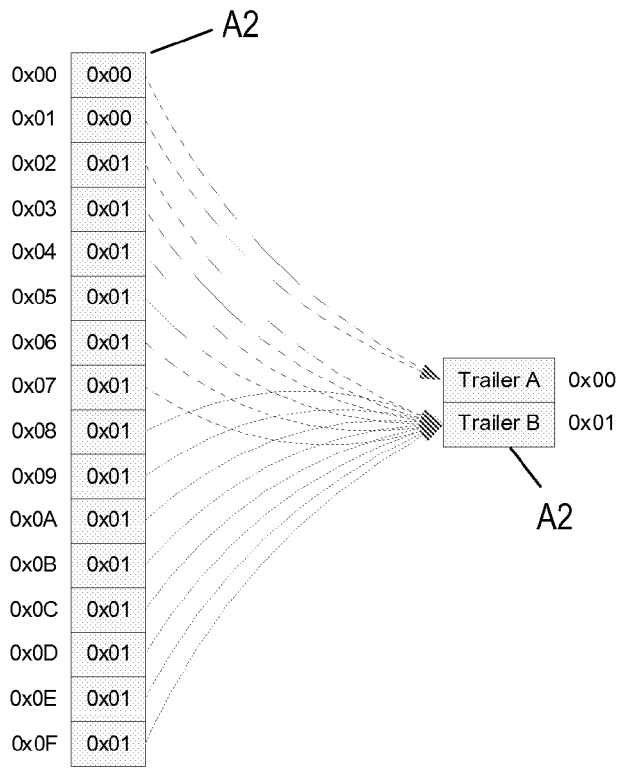
FIG. 6 shows a representation of a sector trailer values table and a sector index table constituting elements of the present MIFARE application compressing method.

Returning to the observations on MIFARE application sector trailers a first aspect of the present compression algorithm concerns a factorization of all the sector trailers which is shown in the chart of FIG. 6. Factorization means that instead of having sixteen sector trailers to be transmitted a sector trailer values table A1 is created that contains all different and only different sector trailer values of the MIFARE application, and a sector index table A2 is created that defines for each sector which sector trailer value of the sector trailer values table A1 corresponds to the sector trailer of the respective sector. For the MIFARE application example of FIG. 5 these compression rules result in a sector trailer values table A1 with two elements, namely an element with index 0 containing Trailer A and an element with index 1 containing Trailer B. The sector index table A2 comprises sixteen elements each being allocated to a respective one of the sectors 0x00 to 0x0F of the MIFARE application MIA. As can be seen in FIG. 6 the first two elements of sector index table A2 contain the value 0 (pointing to Trailer A in element 0 of the sector trailer values table A1) and the next fourteen elements of sector index table A2 contain the value 1 (pointing to Trailer B in element 1 of the sector trailer values table A1). By implementing these compressing rules in the present MIFARE application compression algorithm CMP the sender 1 now has to send the sector trailer values table A1 which comprises two sector trailer values (altogether 32 bytes) and the sector index table A2 which comprises 16 bytes, instead of having to send for our uncompressed MIFARE application example, sixteen sector trailers of 16 bytes each, meaning 256 bytes. By using the proposed MIFARE application compression a compression rate close to 80% for the sector trailer can be achieved.

A second aspect of the present compression algorithm concerns the MIFARE application sector data. Remember that the sector data of each sector of a MIFARE application comprise three blocks of 16 bytes length. The goal of this aspect is to replace blocks containing the same values by the values themselves. In order to accomplish that, the following format is adopted for all the sector data: each sector will be separated from the adjacent ones by a special sector separating character, for example the character "/" and each block within a sector will be separated by a special block separating character, e.g. the character "-". As an additional rule it is defined that if at least two consecutive blocks contain the same data then a first value following a block separating character indicates the data value and a second value indicates the number of consecutive blocks having only data of this value, followed by another block separating character.

Thus, if the length of the data stream between two block separator characters is
  16: this block contains unpredictable data with no compression;
  1: this block contains a series of 16 times the same value (for example, 0x00 means the block is full of 0x00);
  2: this and several following blocks contain the same value (for example, 0x00 0x02 means that this block and the two following blocks are full of 0x00).

Figure 7:
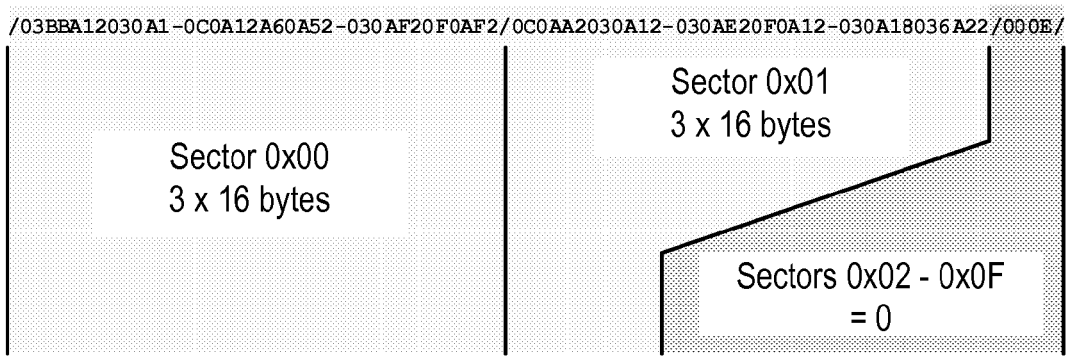
FIG. 7 shows a representation of a data stream constituting an element of the present MIFARE application compressing method.

By implementing these compressing rules in the present MIFARE application compression algorithm CMP the sender 1 now has to send a data stream B to the mobile communication device 2 which data stream B is—for the exemplary MIFARE application of FIG. 5—depicted in FIG. 7 and has a length of 106 bytes example, being composed of 48 bytes (3 blocks of 16 bytes) of unpredictable data of sector 0x00, plus 48 bytes of unpredictable data of sector 0x01, plus two bytes indicating that the fourteen consecutive sectors 0x02 to 0x0F only contain the value 0 in all data elements which is typical for a MIFARE shell application, plus 8 bytes of sector separator characters and block separator characters. Compared to these 106 bytes sending sector data of sixteen sectors of 48 bytes each would amount to 768 bytes. Thus, the proposed compression rules result in a compression rate of approximately 86%.

In order to restore the compressed MIFARE application in the mobile communication device 2 its software SW comprises a decompression module DEC which parses the incoming data in order to detect sector trailer values tables A1, sector index tables A2 and compressed data streams B and to distinguish them from uncompressed MIFARE applications MIA. Distinguishing can for instance be done very easily when the sector trailer values tables A1, the sector index tables A2, the compressed data streams B and the uncompressed MIFARE applications are provided with specific header flags which can be added prior to sending at the sender's side. If the decompression module DEC detects a sector trailer values table A1 and a matching sector index table A2 it reconstructs the sector trailers of all sectors by inversely applying the compression rules of the first aspect of the present compression algorithm. If the decompression module DEC detects a compressed data stream B it reconstructs the sector data of all sectors by inversely applying the compression rules of the second aspect of the present compression algorithm. If the decompression module DEC detects an uncompressed MIFARE application MIA it leaves it untouched.

The present compression and decompression methods may be embedded in form of either hardware or by the aid of software executable by the data processing devices at the sender 1 and in the mobile communication device 2. In many situations a computer program product that comprises software code portions for performing the steps of the method according to the invention when the computer program product is run on the data processing device is already pre-stored in such a data processing device, e.g. in a ROM or EPROM or any other permanent memory. It may also be that the computer program product can be loaded into the data processing device by the aid of a data carrier on which the computer program product is stored. In both cases the computer program product is typically loaded into the working memory of the device, e.g. the RAM, and software portions of the computer program are executed by a processor of the device.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The indefinite article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method for compressing contactless smart card applications, which are organized in at least one sector comprising sector data being arranged in data blocks and a sector trailer, wherein the compressing method comprises:
    searching for consecutive occurrences of same data values in the sector data and replacing the detected consecutive data having the same data value by a sequence comprising said data value and a number indicating the number of consecutive sector data having that data value; and
    searching for all different sector trailer values and replacing all sector trailers by references to respective ones of the different sector trailer values.

2. The compressing method as claimed in claim 1, wherein the blocks of the sector data are searched for occurrences of same data values throughout the whole block and every block detected that contains the same data value in all of its data element is replaced by its data value.

3. The compressing method as claimed in claim 2, wherein if at least two consecutive blocks are detected that contain the same data value in all of their data elements then these blocks are replaced by a sequence comprising said data value and a number indicating the number of the detected consecutive blocks.

4. The compressing method as claimed in claim 2, wherein the data representing the blocks are separated by a predefined block separating character.

5. The compressing method as claimed in claim 2, wherein the sectors are separated by a predefined sector separating character.

6. The compressing method as claimed in claim 1, wherein a sector trailer values table is created that contains all different sector trailer values and a sector index table is created that defines for each sector which sector trailer value of the sector trailer values table corresponds to the sector trailer of the respective sector.

7. The method of claim 1, wherein the applications are organized in at least two sectors, and the step of searching for all different sector trailer values and replacing all sector trailers comprises replacing the sector trailers of at least two sectors having the same sector trailer value by references to the same one of the different sector trailer values.

8. A non-transitory computer-readable storage medium encoded with instructions executable by a processor, the non-transitory computer-readable storage medium comprising instructions for performing the method of claim 1.

9. A method for decompressing a data stream that contains a contactless smart card application that has been compressed, the decompressing method comprising:
    parsing the data stream for compressed data of the application comprising a data value and a number of consecutive data sectors having the data value;
    parsing the data stream for a sector trailer values table having at least one trailer value and a sector index table having a reference to a trailer value of the sector trailer values table for each data sector;
    replacing the compressed data of the application with the data value repeated the number of consecutive data sectors; and
    for each reference in the sector index table, adding a trailer to the corresponding sector having the referenced sector trailer value.

10. The method of claim 9, wherein the step of parsing the data stream for compressed data of the application comprises detecting a specific header flag.

11. The method of claim 10, wherein the specific header flag is a special sector separating character or a special block separating character.

12. The method of claim 9, further comprising detecting an uncompressed application and leaving the uncompressed application untouched.

13. The method of claim 9, further comprising:
    parsing the data stream for compressed data of the application comprising a data value and a number of consecutive data blocks having the data value in all of their data elements; and replacing the compressed data of the application with the number of consecutive data blocks, each of the consecutive data blocks containing the same data value in all of its data elements.

14. A non-transitory computer-readable storage medium encoded with instructions executable by a processor, the non-transitory computer-readable storage medium comprising instructions for performing the method of claim 9.

15. A mobile communications device configured to receive a data stream including a compressed application, the mobile communication device comprising:
   a contactless smart card having a plurality of data sectors, each data sector associated with a trailer;
   a decompression module configured to generate a decompressed application by:
      parsing the data stream for compressed data of the compressed application comprising a data value and a number of consecutive data sectors having the data value;
      parsing the data stream for a sector trailer values table having at least one trailer value and a sector index table having a reference to a trailer value of the sector trailer values table for each data sector;
      replacing the compressed data of the compressed application with the data value repeated the number of consecutive data sectors; and
      for each reference in the sector index table, adding a trailer to the corresponding sector having the referenced sector trailer value; and
   an applications manager configured to install the decompressed application in the contactless smart card.

16. The mobile communications device of claim 15, wherein the decompression module is configured to parse the data stream for compressed data of the application by detecting a specific header flag.

17. The mobile communications device of claim 16, wherein the specific header flag is a special sector separating character or a special block separating character.

18. The mobile communications device of claim 15, wherein the decompression module is further configured to:
   parse the data stream for compressed data of the application comprising a data value and a number of consecutive data blocks having the data value in all of their data elements; and
   replace the compressed data of the application with the number of consecutive data blocks, each of the consecutive data blocks containing the same data value in all of its data elements.

19. The mobile communications device of claim 15, wherein the mobile communications device is a mobile phone having NFC capabilities.

* * * * *